(12) United States Patent
Park (10) Patent No.: US 9,645,299 B2
(45) Date of Patent: May 9, 2017

(54) LIGHT UNIT AND DISPLAY APPARATUS HAVING THE SAME

(75) Inventor: Jun Seok Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 1623 days.

(21) Appl. No.: 13/075,575

(22) Filed: Mar. 30, 2011

(65) Prior Publication Data

US 2011/0242846 A1  Oct. 6, 2011

(30) Foreign Application Priority Data

Apr. 1, 2010  (KR) ........................ 10-2010-0030017

(51) Int. Cl.
| | |
|---|---|
| *F21V 8/00* | (2006.01) |
| *G02B 27/09* | (2006.01) |
| *H01L 25/075* | (2006.01) |
| *G02B 19/00* | (2006.01) |
| *G02F 1/1335* | (2006.01) |
| *H01L 33/58* | (2010.01) |

(52) U.S. Cl.
CPC ......... *G02B 6/003* (2013.01); *G02B 19/0014* (2013.01); *G02B 19/0066* (2013.01); *G02B 27/0966* (2013.01); *H01L 25/0753* (2013.01); *G02B 6/0055* (2013.01); *G02B 6/0068* (2013.01); *G02B 6/0073* (2013.01); *G02F 1/133603* (2013.01); *G02F 2001/133607* (2013.01); *H01L 33/58* (2013.01); *H01L 2924/0002* (2013.01)

(58) Field of Classification Search
CPC  G02B 6/003; G02B 19/0066; G02B 19/0014; G02B 27/0966; G02B 6/0068; G02B 6/0073; G02B 6/0055; H01L 25/0753; H01L 2924/0002; H01L 33/58; G02F 2001/133607; G02F 1/133603
USPC .............. 362/219, 217.02, 217.04, 612, 613
See application file for complete search history.

(56) References Cited

U.S. PATENT DOCUMENTS

| | | | |
|---|---|---|---|
| 6,607,286 B2 * | 8/2003 | West .......................... | F21V 5/04 |
| | | | 257/E33.072 |
| 7,046,907 B2 | 5/2006 | Miyashita ...................... | 385/146 |
| 7,287,891 B1 * | 10/2007 | Park .................. | G02F 1/133603 |
| | | | 362/555 |
| 7,422,347 B2 | 9/2008 | Miyairi et al. ................ | 362/335 |
| 7,794,118 B2 * | 9/2010 | Huang .................... | H01L 33/58 |
| | | | 362/310 |

(Continued)

FOREIGN PATENT DOCUMENTS

| | | |
|---|---|---|
| CN | 200952671 Y | 9/2004 |
| CN | 1655032 A | 8/2005 |

(Continued)

OTHER PUBLICATIONS

Chinese Office Action date May 10, 2013 issued in Application No. 201110084602.6.

(Continued)

*Primary Examiner* — Stephen F Husar
(74) *Attorney, Agent, or Firm* — KED & Associates LLP (57) ABSTRACT

Disclosed are a light unit and a display apparatus including the same. The light unit includes a lens including a flat light incident part having a pattern and a light exit part, a plurality of light emitting devices below the incident part of the lens, and a substrate having the light emitting devices mounted thereon.

20 Claims, 11 Drawing Sheets

(56) References Cited

U.S. PATENT DOCUMENTS

| | | | |
|---|---|---|---|
| 8,052,307 B2* | 11/2011 | Bak ................ F21V 5/04 362/249.02 |
| 8,284,350 B2 | 10/2012 | Abe et al. ............... 349/68 |
| 2004/0080835 A1* | 4/2004 | Chinniah et al. ......... 359/708 |
| 2005/0243576 A1* | 11/2005 | Park et al. ............... 362/612 |
| 2006/0186431 A1* | 8/2006 | Miki ............. H01L 33/505 257/100 |
| 2006/0198144 A1 | 9/2006 | Miyairi et al. |
| 2008/0062715 A1 | 3/2008 | Park et al. ............... 362/612 |
| 2009/0207586 A1 | 8/2009 | Arai et al. ............... 362/97.1 |
| 2010/0135028 A1 | 6/2010 | Kokubo |
| 2014/0209951 A1* | 7/2014 | Kong ............. H01L 33/58 257/98 |

FOREIGN PATENT DOCUMENTS

| | | |
|---|---|---|
| CN | 1831422 A | 9/2006 |
| CN | 101307872 A | 11/2008 |
| CN | 101639181 A | 2/2010 |
| EP | 1 693 904 A2 | 8/2006 |
| JP | 2007-311588 A | 11/2007 |
| JP | 2009-192915 A | 8/2009 |
| KR | 10-2008-0023007 A | 3/2008 |
| KR | 10-2008-0033000 A | 4/2008 |
| KR | 10-2008-0064262 A | 7/2008 |
| KR | 10-0939455 B1 | 1/2010 |
| KR | 10-2010-0031397 A | 3/2010 |
| WO | WO 2008/062812 A1 | 5/2008 |
| WO | WO 2009-020214 A1 | 12/2009 |

OTHER PUBLICATIONS

Korean Office Action dated Apr. 20, 2011 issued in Application No. 10-2010-0030017.

European Search Report dated Aug. 2, 2012 issued in Application No. 11 16 0424.

Chinese Office Action dated Sep. 20, 2012 issued in Application No. 201110084602.6.

* cited by examiner

LIGHT UNIT AND DISPLAY APPARATUS HAVING THE SAME

The present application claims priority of Korean Patent Application No. 10-2010-0030017 filed on Apr. 1, 2010, which is hereby incorporated by reference in its entirety.

BACKGROUND

The embodiment relates to a light unit and a display apparatus having the same.

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by luminescence materials or combining LEDs having various colors.

SUMMARY

The embodiment provides a light unit including a semi-cylinder lens disposed on a plurality of light emitting devices and a display apparatus having the same.

The embodiment provides a light unit including a semi-cylinder lens having a pattern formed at a part receiving lights emitted from a plurality of light emitting devices and a display apparatus having the same.

According to the embodiment, the light unit includes a lens including a light incident part having a first pattern and a light exit part, a plurality of light emitting devices arrayed under the incident part of the lens, and a substrate having the light emitting devices mounted thereon, wherein the light incident part of the lens includes a flat surface and the lens has a length different from a width of lens, and the first pattern of the light incident part of the lens is disposed at a central portion of the light incident part and is formed in the length of the lens and having a concave shape.

According to the embodiment, the light unit includes a substrate, a plurality of light emitting diodes disposed in a first direction on the substrate, a lens on the light emitting diodes, and an adhesive member between the substrate and the lens. The lens includes a light incident part having a first pattern in the first direction, and a light exit part to emit a light incident through the light incident part, wherein the light incident part of the lens is formed in a fiat shape and the lens has a length different from a width of lens, and the first pattern of the light incident part of the lens is disposed at a central portion of the light incident part and is formed in the length of the lens and having a concave shape.

According to the embodiment, a display apparatus includes a plurality of light emitting devices, a substrate having the light emitting devices arrayed in a first direction, a lens on the light emitting devices, an optical member including at least one of a light guide plate and the optical sheet at one side of the lens, and a display panel on the optical member. The lens includes a light incident part on the light emitting device, a pattern having a semi-cylinder shape and disposed in the first direction of the light incident part, and a light exit part to output a light incident through the light incident part.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 1:
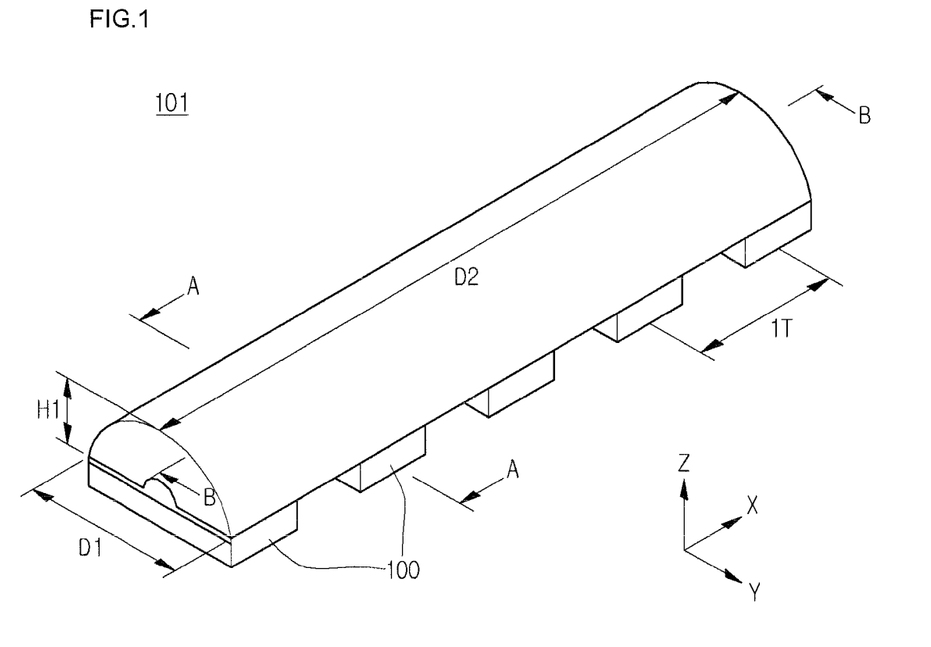
FIG. 1 is a perspective view showing a light emitting module according to a first embodiment.
Figure 2:
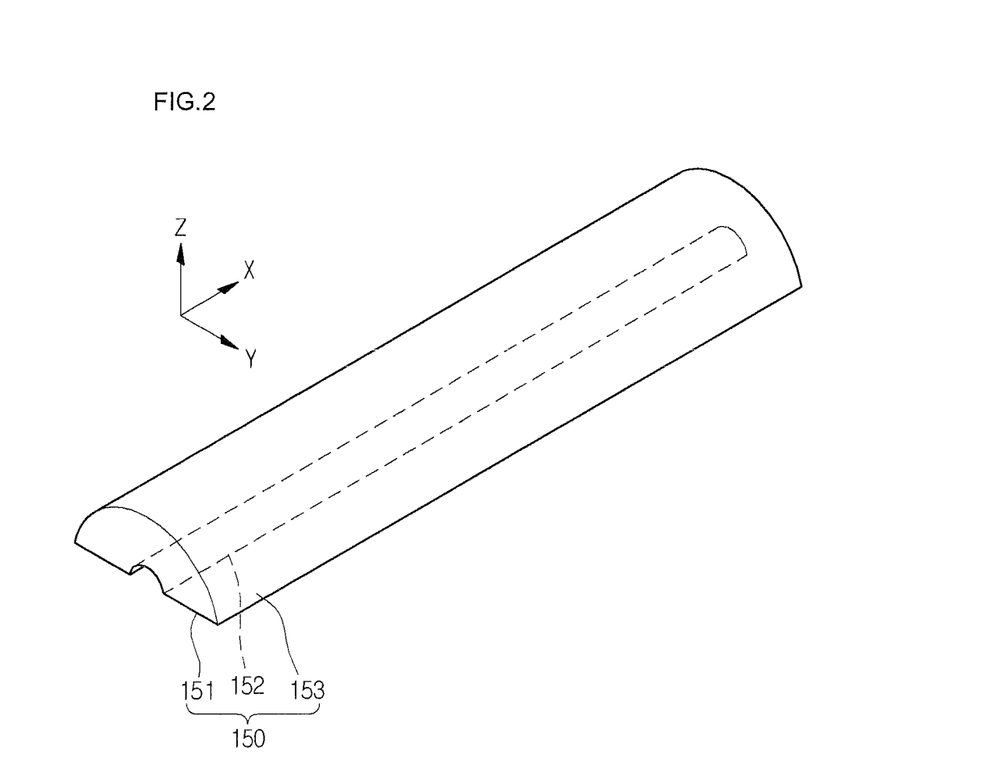
FIG. 2 is a perspective view showing a lens of FIG. 1.
Figure 3:
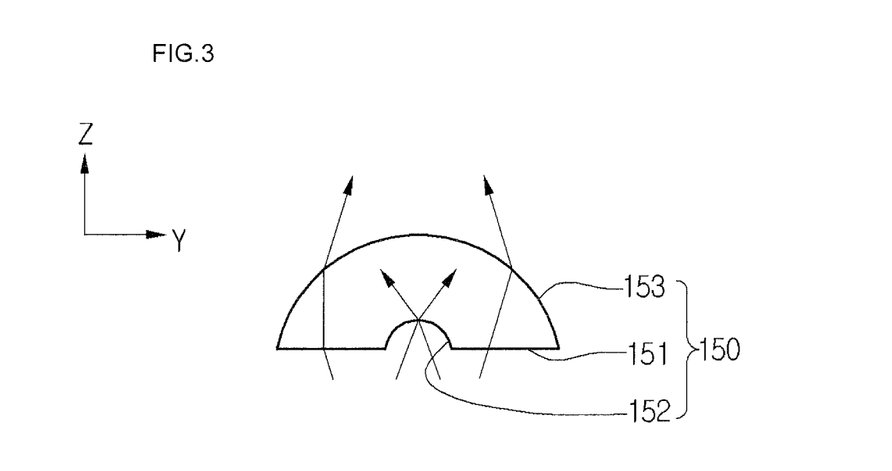
FIG. 3 is a view showing an example of light exit in the lens of FIG. 1.
Figure 4:
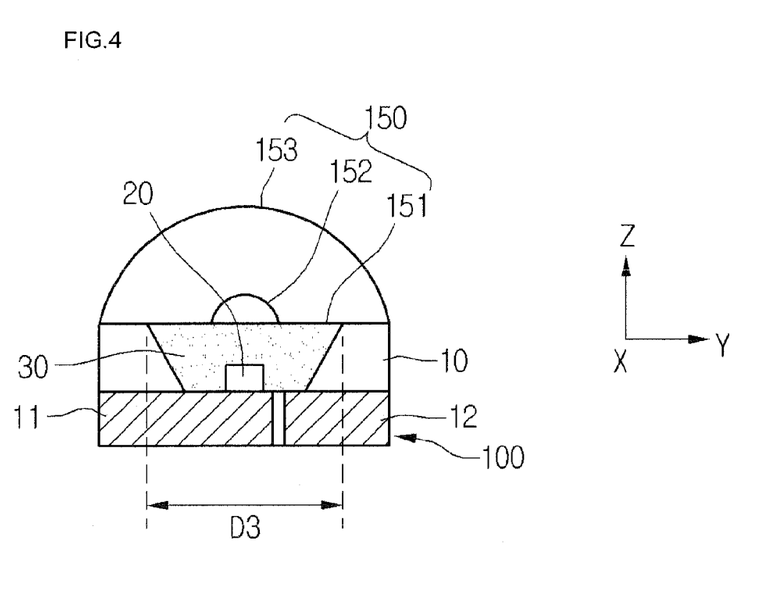
FIG. 4 is a sectional view taken along line A-A of FIG. 1.
Figure 5:
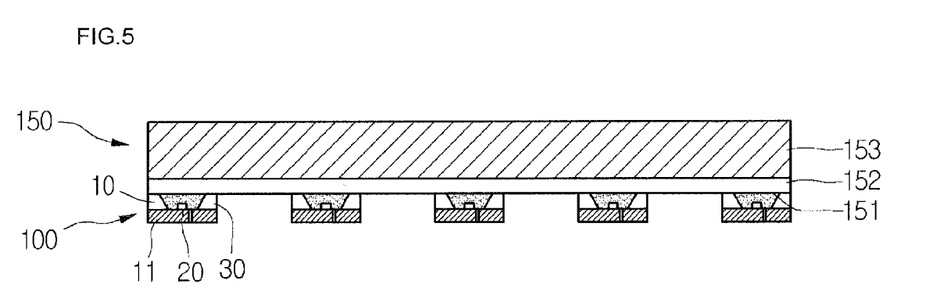
FIG. 5 is a sectional view taken along line B-B of FIG. 1.

FIG. 1 is a perspective view showing a light emitting module according to a first embodiment, and FIG. 2 is a perspective view showing a lens of FIG. 1. FIG. 3 is a view showing an example of light exit in the lens of FIG. 1, and FIG. 4 is a sectional view taken along line A-A of FIG. 1. FIG. 5 is a sectional view taken along line B-B of FIG. 1.

Referring to FIGS. 1 to 5, a light emitting module 101 includes a plurality of light emitting devices 100 and a lens 150 having a predetermined length. The lens may include a semi-cylinder lens.

The light emitting devices 100 include at least one of devices emitting red, green, UV (ultraviolet), white lights. The lights emitted from the light emitting devices 100 may include a light emitted from a light emitting diode or a light mixed with another color light.

The light emitting devices 100 are arrayed under the lens 150 in an X axis direction of the lens 150. The X axis direction of the lens 150 may be defined as a longitudinal direction of the lens 150.

The light emitting devices 100 may be arranged at a uniform interval or may be arranged at an irregular interval. The lens 120 has a length to cover the light emitting devices 100 above the light emitting devices 100. The lens 150 has an outer shape such as a hemispherical shape or a semi-cylinder lens shape.

The light emitting devices 100 may be disposed on one support member or a plurality of support members. The support member may include a substrate or a heat radiation plate, but the embodiment is not limited thereto. The light emitting devices 100 are mounted on the substrate and may be connected to each other in series and/or in parallel.

Referring to FIGS. 4 and 5, the light emitting devices 100 include a body 10, lead electrodes 11 and 13, a light emitting diode 20, and a resin member 30. The body 10 may include silicon (Si), aluminum (Al), aluminum nitride (AlN), AlOx, PSG (photo sensitive glass), sapphire (Al2O3), beryllium oxide (BeO), PCB (Printed Circuit Board), or various resin materials (e.g., PPA), but the embodiment is not limited thereto.

If the body 10 includes an electrical conductivity material, an insulating layer (not shown) is formed on the surface of the body 10, thereby preventing the body 110 from being shorted with respect to other frames. One lead electrode or a plurality of electrodes can be disposed. The lead electrodes 11 and 13 may include a metallic material representing electrical conductivity. For example, the lead electrodes 11 and 13 may include at least one selected from the group consisting of titanium (Ti), copper (Cu), nickel (Ni), gold (Au), chromium (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), and iron (Fe), or the alloy thereof The first and second lead electrodes 11 and 13 may have a single layer structure or a multiple layer structure, but the embodiment is not limited thereto. The lead electrodes 11 and 13 may be formed through an injection molding process of the body 10. In this ease, the lead electrodes 11 and 13 may penetrate through the body 10.

The cavity 30 may be formed at the upper portion of the body 10, and portions of the lead electrodes 11 and 13 may be disposed in the cavity 30. The light emitting diode 20 may be electrically connected to the lead electrodes 11 and 13 in the cavity 10. The cavity 30 may be formed independently from the body 10 or may not be formed independently from the body 10. In addition, the cavity 30 may have a multi-cavity structure instead of a single-layer cavity structure. The lateral surface of the cavity 30 may be inclined, but the embodiment is not limited thereto.

A resin member is formed on the light emitting diode 20. When the light emitting diode 20 is disposed in the cavity 30, the resin member may be molded in the cavity 30. The resin member includes a transmissive resin material such as epoxy or silicon. The resin member may include a transmissive material having a low refractive index (e.g., n<2.3) to guide a light emitted from the light emitting diode 20 to the outside. The surface (i.e., light exit surface) of the resin member may include one of a concave shape, a flat shape, and a convex shape, but the embodiment is not limited thereto.

A width D3 of the light exit surface of the light emitting device 100 may be equal to or less than a width D1 (see FIG. 1) of the lens 150, so that most light emitted from the light exit surface of the light emitting device 100 can be incident into the lens 150 without light loss. The length of the light emitting device 100 in a Y axis direction may be less that or greater than the width D1 of the lens 150, but the embodiment is not limited thereto.

The light emitting devices 100 may be connected to each other in series or several light emitting devices 100 may be connected to each other in parallel, but the embodiment is not limited thereto.

As shown in FIGS. 1 to 4, the lens 150 may have a hemi-cylindrical shape, a semi-spherical shape, or a polygonal shape in which the length D2 of the lens 150 in the X axis direction is longer than the width D1 of the lens 150 in the Y axis direction. The X axis direction is perpendicular to the Y axis direction, and a Z axis direction is perpendicular to the X axis direction or the Y axis direction, thereby forming directions to output lights. The length D2 of the lens 150 may be two times longer than the width D1 of the lens 150, or may be a length to array several light emitting devices 100.

The lens 150 may include a plastic material or a glass material. In addition, the lens 150 may include a resin material or a light transmissive material having a refractive index approximately identical to that of the resin member.

Referring to FIGS. 2 and 3, the lens 150 includes a light incident part 151, a pattern 152 formed at a predetermined region of the light incident part 151 in the X axis direction, and a light exit part 153 to output a light.

The light incident part 151 of the lens 150 receives a light, and the pattern 152 refracts or diffuses the light. The pattern 152 has a semi-cylinder shape, and may be formed in a concaved shape on the substantially flat surface of the light incident part 151. The light exit part 153 is disposed in opposition to the light incident part 151 to concentrate the light incident onto the light incident part 151 and the pattern 152. The light incident part 151 has an area narrower than that of the light exit part 153. For example, the light incident part 151 actually has the flat shape, and the light exit part 153 has a hemi-spherical shape.

The light incident part 151 of the lens 150 receives the incident light, and the pattern 152 diffuses the incident light into the lens. The light exit part 153 concentrates lights incident through the light incident part 151 and the pattern 152. The light incident part 151 has a size small than that of light exit part 153. The light incident part 151 is formed of a substantially plane shape and the light exit part 153 is formed of a substantially hemisphere shape.

Referring to FIGS. 1 and 4, the pattern 152 of the lens 150 is disposed substantially perpendicularly to the light emitting diode 10 of the light emitting device 100. Air may be filled in the region P1 (see FIG. 4) between the pattern 152 and the light exit surface of the light emitting device 100 or another transmissive resin layer may be disposed in the region P1 (see FIG. 4) between the pattern 152 and the light exit surface of the light emitting device 100.

The light incident part 151 of the lens 150 may be attached to the top surface of the light emitting device 100 by using an adhesive agent, and the adhesive agent may include a transmissive adhesive agent such as silicon or epoxy. The light transmissive adhesive agent transmits a light output through the light exit surface of the light emitting device 100 to the lens 150 without light loss. In this case, the reflectance on the light exit surface of the light emitting device 100 can be reduced. The light incident part 151 of the lens 150 may make contact with the light exit surface of the light emitting device 100 or may not make contact with the light exit surface of the light emitting device 100.

In this case, although the interval T between the light emitting devices 100 disposed under the lens 150 is not constant, the lights emitted from the light emitting device 100 are diffused and refracted by the lens 150 and concentrated within a predetermined light irradiation range. Accordingly, the lights emitted from the light emitting device 100 are incident into the lens 150 and concentrated by the lens 150, so that light loss can be reduced. The light irradiation range may vary according the diameter or the width of the lens 150.

The lens 150 can concentrate lights, which are incident at various angles, through the light exit part 153, so that the uniformity in the light intensity and chromaticity can be improved.

Figure 6:
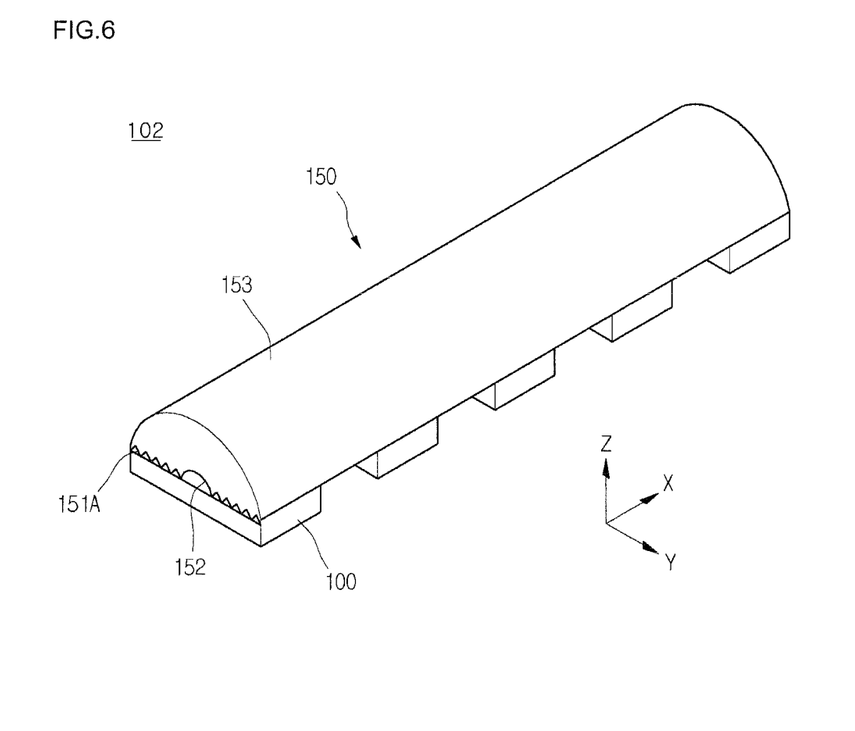
FIG. 6 is a perspective view showing a light unit according to a second embodiment.

FIG. 6 is a view showing a light emitting module 102 according to the second embodiment.

Referring to FIG. 5, the light emitting module 102 includes patterns 152 and 151A having different shapes and formed at a light incident part of the lens 150. The patterns 152 and 151A include the first pattern 152 having the shape of a semi-cylinder and the second patterns 151A having the shape of a polygonal prism at both sides of the first pattern 152. The second patterns 151A having the shape of the polygonal prism are arranged in the shape of the concave pattern such as the shape of a chopping wave or a sawtooth wave.

In the second patterns 151A, concave patterns and convex patterns are alternately aligned with each other at a uniform interval or an irregular interval. In addition, the second patterns 151A may be arranged at an interval gradually narrowed or widened in an outward direction The lengths of the first pattern 152 and the second patterns 151A may be equal to the length of the lens 150.

The light incident part of the lens 150 diffuses the light incident into the first pattern 152, and changes the critical angle of the light by the second patterns 151A to reduce a reflected light.

Accordingly, since the lens 150 can concentrate lights incident at various angles through the light exit part 153, so that the uniformity in the light intensity and chromaticity can be improved.

Figure 7:
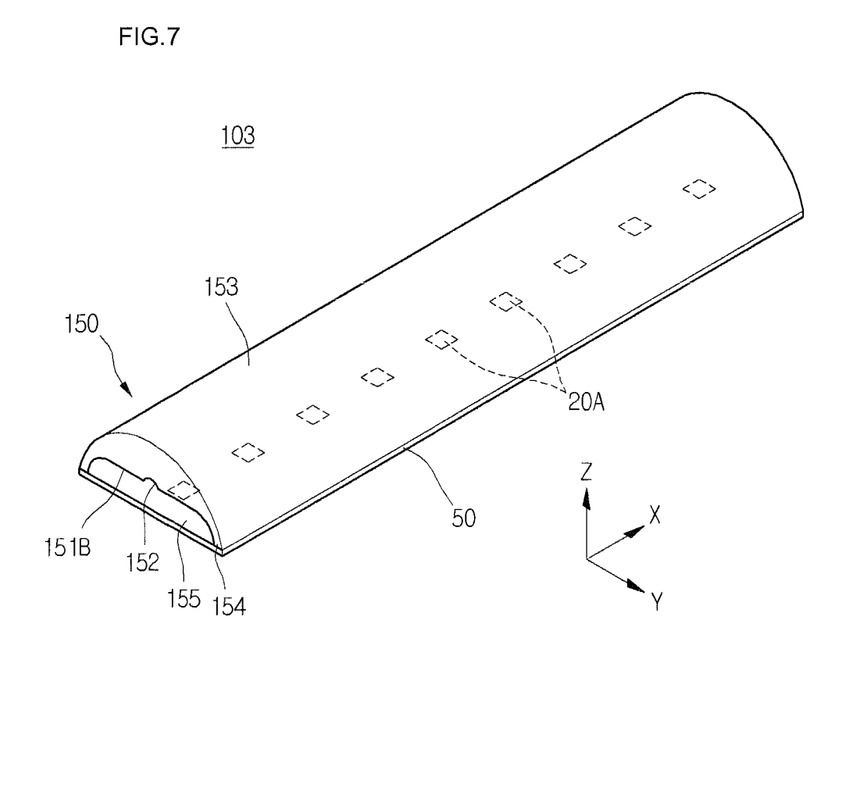
FIG. 7 is a perspective view showing a light unit according to a third embodiment.

FIG. 7 is a perspective view showing a light emitting module 103 according to a third embodiment.

Referring to FIG. 7, in the light emitting module 103, a plurality of devices 20A are arrayed on a substrate 50, and the lens 150 is disposed on the light emitting devices 20A.

The substrate 50 may include a PCB (Printed Circuit Board) including a circuit pattern (not shown). The substrate 50 may include an MCPCB (Metal Core PCB) or an FPCB (Flexible PCB) as well as a typical PCB, but the embodiment is not limited thereto.

The light emitting devices 20A include a light emitting diode disposed on the substrate 50, or a light emitting diode package as shown in FIG. 4. The light emitting devices 20A are arrayed at a uniform interval or an irregular interval corresponding to the first pattern 152 of the lens 150.

The lens 150 includes a support part 154, and the support part 154 is disposed at both sides of the lens 150. The support part 154 more protrudes downward than the light incident part 151B protrudes. The support part 154 is disposed at both sides of the substrate 50.

An adhesive member 155 is disposed between the light incident part 151B of the lens 150 and the substrate 50. The adhesive member 155 includes a light transmissive adhesive agent or a resin member.

Figure 8:
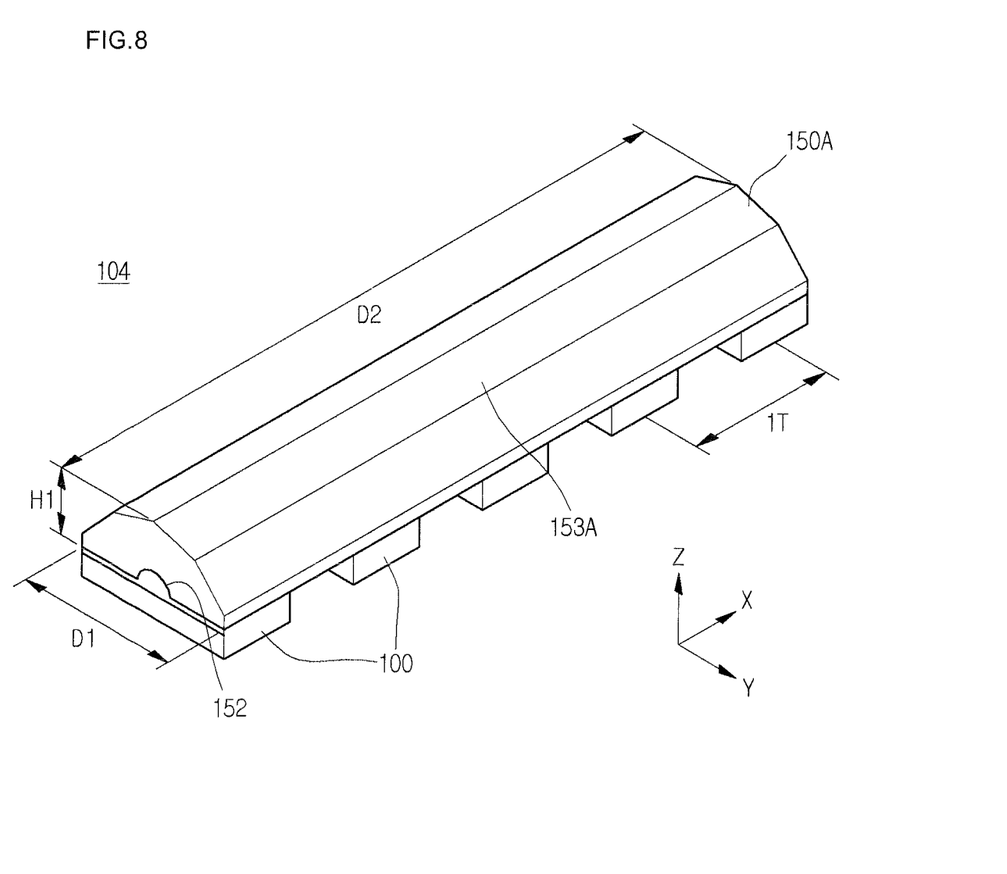
FIG. 8 is a perspective view showing a light unit according to a fourth embodiment.

FIG. 8 is a perspective view showing a light emitting module 104 according to a fourth embodiment.

Referring to FIG. 8, the light emitting module 104 includes a lens 150A to cover the light emitting devices 100 above the light emitting devices 100.

The lens 150A may have the shape of a semi-cylinder. A light exit part 153A of the lens 150A may have a many-sided structure, for example, a six-sided structure. The light ext part 153A of the lens 150A diffuses a light incident through a light incident part to both sides thereof FIG. 9 is a perspective view showing a light emitting module 105 according to a fifth embodiment.

Figure 9:
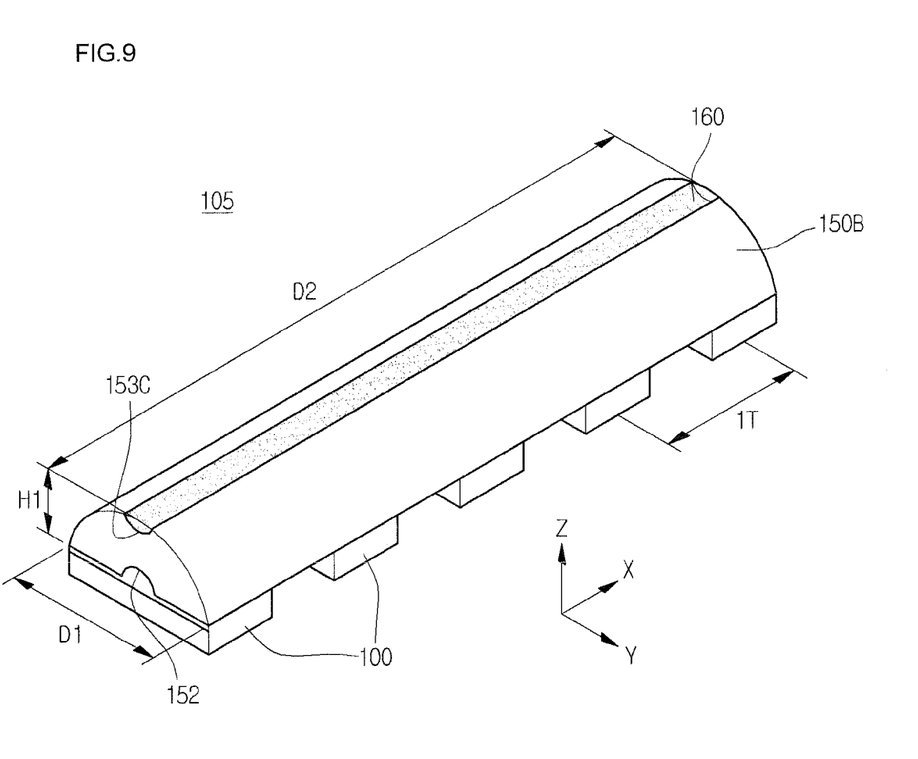
FIG. 9 is a perspective view showing a light unit according to a fifth embodiment.

Referring to FIG. 9, the light emitting module 105 includes a lens 150B to cover the light emitting devices 100 above the light emitting devices 100. The lens 150B includes a light exit part 153B having a hemi-spherical shape. The light exist part 153B is disposed at the central portion thereof with a concave groove 153C formed in the longitudinal direction of the lens 150B, and the concave groove 153C is disposed therein with a reflective member 160. The reflective member 160 may diffuse an incident light to both sides or transmit a portion of the light. The reflective member 160 may include at least one selected from the group consisting of a metallic material including aluminum (Al) or silver (Ag), a photoresist material, and a metallic oxide such as TiO2. The reflective member 160 may include a material representing reflectance higher than light transmittance. The lens 150B can diffuse the light incident from the light emitting devices 100 to both sides.

The light emitting module according to the embodiment is applicable to the light unit. The light unit is applicable to a display apparatus shown in FIGS. 10 to 13. In addition the light unit is applicable to lighting, a signal lamp, a headlamp of a vehicle, and an electronic display board.

Figure 10:
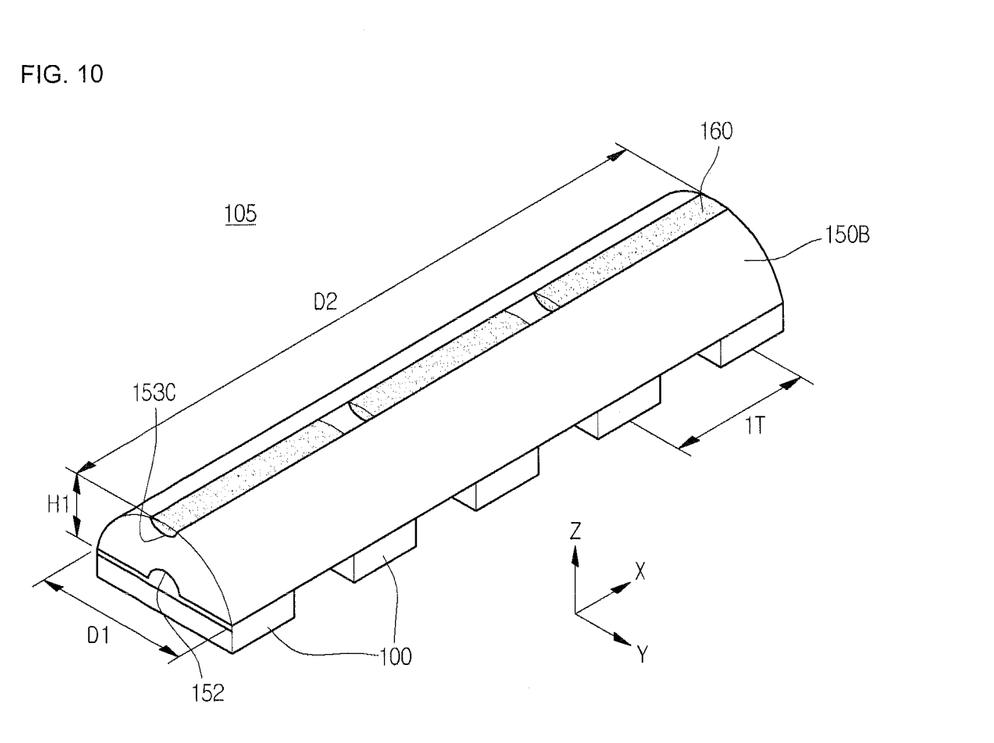
FIG. 10 is a perspective view showing a display apparatus including an another light emitting module of FIG. 9.

FIG. 10 is a perspective view showing another light emitting module 105 of FIG. 9.

Referring to FIG. 10, the light emitting module 105 includes a lens 150B to cover the light emitting devices 100 above the light emitting devices 100. The light exist part 153B is disposed at the central portion thereof with a concave groove 1530 formed in the longitudinal direction of the lens 1508, and the concave groove 153C is disposed therein with a plurality of reflective members 160. An interval between the reflective members 160 has a regular interval or an irregular interval. The reflective members 160 may include at least one selected from the group consisting of a metallic material including aluminum (Al) or silver (Ag), a photoresist material, and a metallic oxide such as TiO2. The reflective members 160 may include a material representing reflectance higher than light transmittance. The groove 153C in the light exit part 153B may be formed in plurality.

Figure 11:
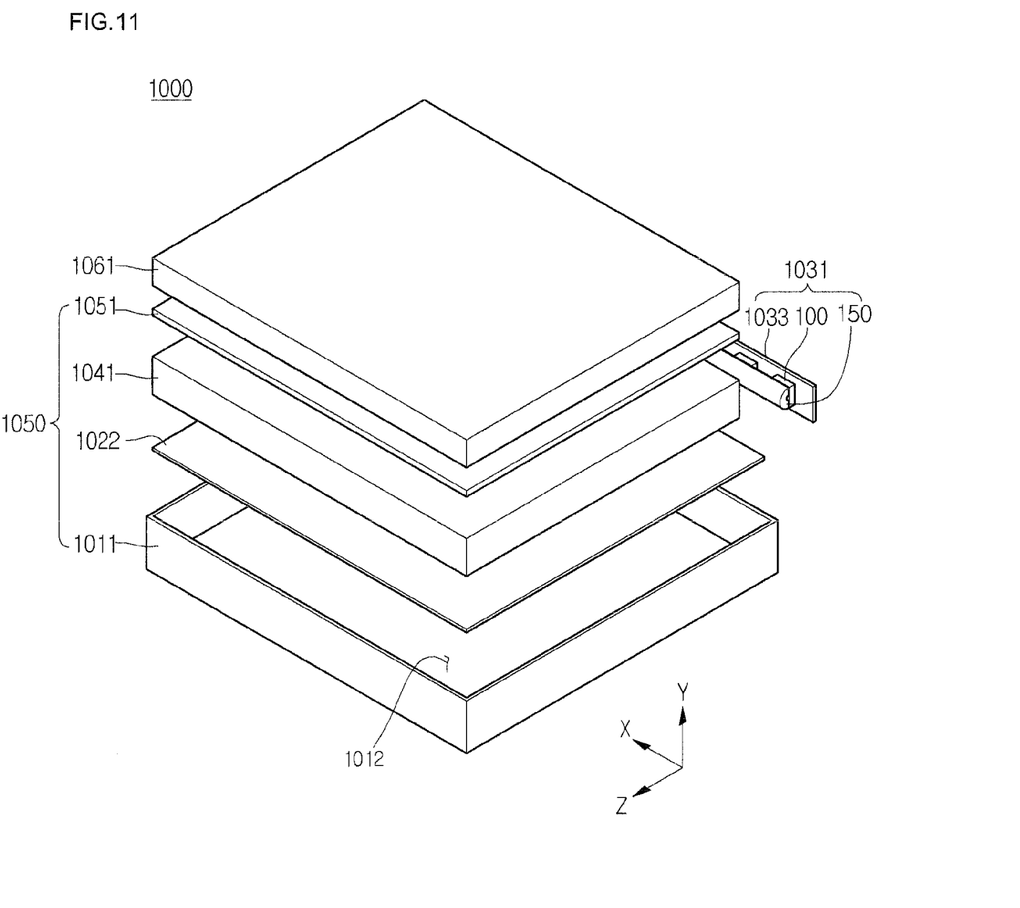
FIG. 11 is a perspective view showing a display apparatus including a light emitting module according to the embodiment.

FIG. 11 is a view showing a display apparatus 1000 including the light emitting module according to the embodiment.

Referring to FIG. 11, the display apparatus 1000 includes a light guide plate 1041, a light emitting module 1031 to supply a light to the light guide plate 1041, a reflective plate 1022 disposed under the light guide plate 1041, an optical sheet 1051 disposed above the light guide plate 1041, a display panel 1051 disposed above the optical sheet 1051, and a bottom cover 1011 to receive the light guide plate 1041, the light emitting module 1031, and the reflective plate 1022, but the embodiment is not limited thereto.

The bottom cover 1011, the reflective plate 1022, the light emitting module 1033, the light guide plate 1041, and the optical sheet 1051 may be defined as a light unit 1050.

The light guide plate 1041 diffuses a light to supply a surface light. The light guide plate 1041 includes a transparent material. For example, the light guide plate 1041 may include one selected from the group consisting of acryl-based resin, such as PMMA (polymethyl methacrylate), PET (polyethylene terephthalate), PC (polycarbonate), COC (cycloolefin copolymer) and PEN (polyethylene naphthalate) resin. The bottom surface of the light guide plate 1041 may have a reflective pattern, and the top surface of the light guide plate 1041 may have a flat structure without a pattern or may have a prism pattern.

The light emitting module 1031 supplies a light into the light incident part of the light guide plate 1041. The light emitting module 1031 supplies a light to at least one lateral surface of the light guide plate 1041 to serve as a light source of the display apparatus 1000. A plurality of light emitting modules 1031 may be arranged on at least two lateral surfaces of the light guide plate 1041.

The light emitting module 1031 includes a substrate 1033, a plurality of light emitting devices 100, and a lens 150. The light emitting module 1031 includes one structure disclosed in the embodiments. The lens 150 may be disposed between the light emitting devices 100 and one lateral surface of the light guide plate 1041. The lens 150 may be embedded in the light emitting module 1031 or may be disposed separately from the light emitting module 1031, but the embodiment is not limited thereto.

The light emitting devices 100 may be mounted on a lateral surface of the bottom cover 1011 or a heat radiation plate instead of the substrate 1033. In this case, the substrate 1033 may be omitted.

The lens 150 concentrates lights emitted from the light emitting devices 100 into one lateral surface of the light guide plate 1041, thereby reducing the loss of light leaking between the light guide plate 1041 and the light emitting device 100. The light incident into the light guide plate 1041 is guided into the light guide plate 1041 and changed into a surface light.

The lens 150 may have a length corresponding to a length of one lateral surface of the light guide plate 1041.

The light emitting devices 100 may directly or indirectly supply a light into the light incident part which is one lateral surface of the light guide plate 1041, but the embodiment is not limited thereto.

The reflective plate 1022 may be disposed under the light guide plate 1041. The reflective plate 1022 reflects a light, which is incident from the bottom surface of the light guide plate 1041, upward, so that the brightness of the light unit 1050 can be improved. The reflective plate 1022 may include a sheet including a material, such as Al or Ag, representing high reflectance or may include a surface coated on the bottom cover 1011, but the embodiment is not limited thereto.

The bottom cover 1011 may receive the light guide plate 1041, the light emitting module 1031, and the reflective plate 1022. To this end, the bottom cover 1011 may include a receiving part 1012 having the shape of a box having an open upper portion, but the embodiment is not limited thereto. The bottom cover 1011 may be coupled with a top cover, but the embodiment is not limited thereto.

The bottom cover 1011 may include a metallic material or a resin material, and may be manufactured through a press molding process or an extrusion molding process. The bottom cover 1011 may include a metallic material or a non-metallic material representing superior thermal conductivity, but the embodiment is not limited thereto.

The optical sheet 1051 is disposed between the display panel 1061 and the light guide plate 1041 and includes at least one transmissive sheet. For instance, the optical sheet 1051 includes at least one of a diffusion sheet, a horizontal and vertical prism sheet, a luminescence sheet, and a brightness enhancement sheet. The diffusion sheet diffuses the incident light, the horizontal and vertical prism sheet concentrates the incident light onto the display region, and the brightness enhancement sheet improves the brightness by reusing the lost light. In addition, a protective sheet can be disposed on the display panel 1061, but the embodiment is not limited thereto. The luminescence sheet includes luminescence materials representing one color or various colors. In addition, the luminescence sheet may have a single layer structure or a multi-layer structure including homogeneous luminescence materials or heterogeneous luminescence materials.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by a light passing through the optical sheet 1051. The display device 1000 is applicable to various portable terminals, monitors or laptop computers, and televisions.

The light guide plate 1041 and the optical sheet 1051 can be disposed in the light path of the light emitting module 1031 as optical members, but the embodiment is not limited thereto.

Figure 12:
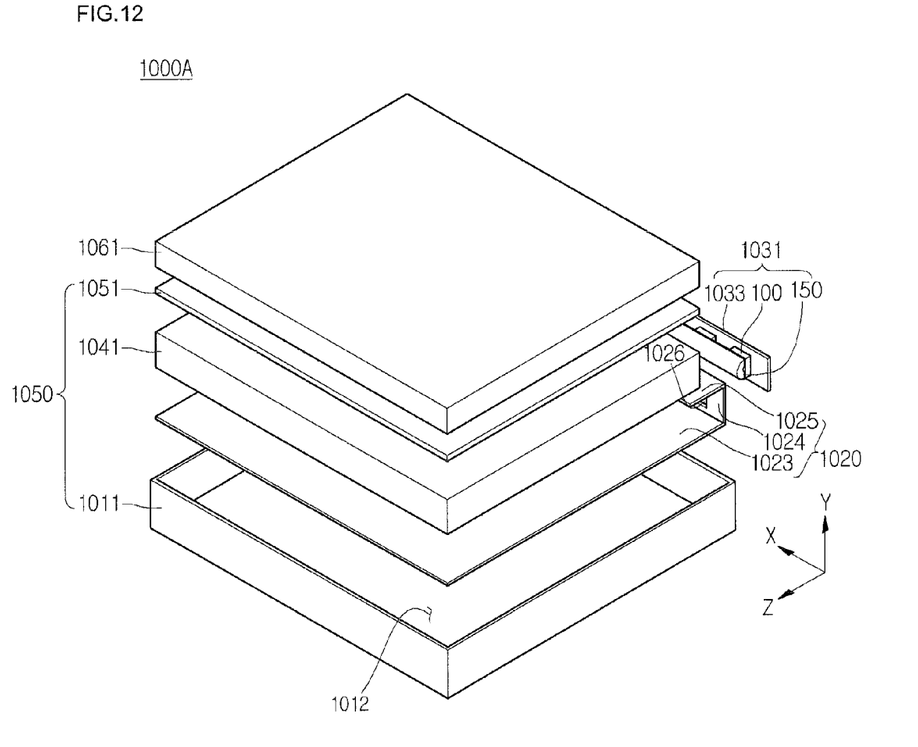
FIG. 12 is a perspective view showing a display apparatus including a light emitting module according to another embodiment.
Figure 13:
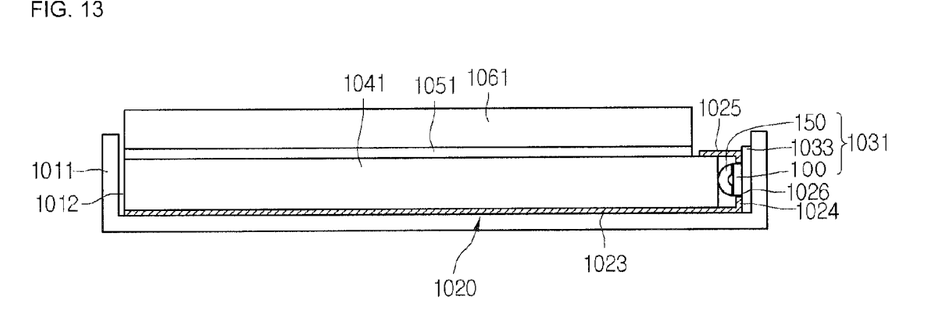
FIG. 13 is a side sectional view of FIG. 12.

FIG. 12 is a perspective view showing a display apparatus 100A including a light emitting module according to the embodiment, and FIG. 13 is a side sectional view showing the assembly of FIG. 12.

Referring to FIGS. 12 and 13, the display apparatus 1000A includes the bottom cover 1011, a reflective plate 1020, the light emitting module 1031, the light guide plate 1041, the optical sheet 1051, and the display panel 1061.

The light emitting module 1031 generates a light and concentrates the light. The light guide plate 1041 changes the light incident from the light emitting module 1031 into a surface light and supplies the surface light to the display panel 1061. The bottom surface of the light guide plate 1041 may have a reflective pattern, and the top surface of the light guide plate 1041 may have a flat structure without a pattern or may have a prism pattern.

The light emitting module 1031 may be coupled with a portion of the reflective plate 1020 on one internal lateral surface of the bottom cover 1011.

The reflective plate 1020 includes a bottom part 1023, a side part 1024, and a top part 1025. The bottom part 1023 is disposed on a bottom surface of the bottom cover 1011 to reflect a light directed downward through the light guide plate 1041 and the light emitting device 100. The side part 1024 is bent from one end of the bottom part 1023 in a vertical direction, and an opening 1026 is defined by the side part 1024 and the bottom part 1023. The opening 1026 may be formed in the array direction (i.e., X axis direction) of the light emitting devices 100. The light emitting devices 100 and the lens 150 may be inserted into the opening 1026.

The side part 1024 of the reflective member 1020 may be attached to the substrate 1033, but the embodiment is not limited thereto. The top part 1025 is bent inward from the side part 1024 so that the top part 1025 is disposed in opposition to one surface of the bottom part 1023.

In this case, the height of the side part 1024 of the reflective plate 1020 may approximately equal to the thickness of the light guide plate 1041 or may be greater than the thickness of the light guide plate 1041. The top part 1025 of the reflective plate 1020 may overlap with an edge of a top surface of the light guide plate 1041.

The top part 1025 and the bottom part 1023 of the reflective plate 1020 are disposed at the top and bottom between the light emitting device 100 and the light guide plate 1041 to reflect a leaking light among lights irradiated from the lens 150. Accordingly, the loss of the light emitted from the light emitting device 100 can be reduced, so that the overall brightness can be improved.

The top part 1025 of the reflective plate 1020 blocks a light leaking upward between the light guide plate 1041 and the substrate 1033 to prevent light leakage. Accordingly, the light leakage can be prevented, so that the reliability for the light unit 1050 can be improved.

Figure 14:
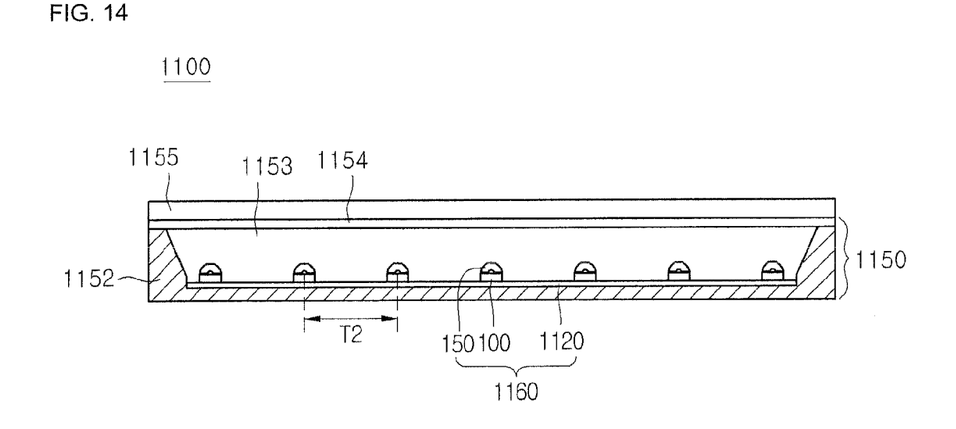
FIG. 14 is a perspective view showing a display apparatus including the light emitting module according to the embodiment.

FIG. 14 is a view showing a display apparatus 1100 including a light emitting module according to the embodiment.

Referring to FIG. 14, the display apparatus 1100 includes a bottom cover 1152, a plurality of light emitting modules 1060 disclosed in the embodiments, an optical member 1154, and a display panel 1155.

The light emitting module 1060 includes the substrate 1120, the light emitting device 100, and the lens 150. The light unit 1050 may include the bottom cover 1152, the light emitting modules 1060, and the optical member 1154.

The bottom cover 1152 may include a receiving part 1153, but the embodiment is not limited thereto.

The light emitting module 1060 includes the light emitting devices 100 disposed on the substrate 1120, and the lens 150 may be disposed on the light emitting devices 100 as shown in FIG. 1. The lens 150 can concentrate a light emitted from the light emitting device 100. Accordingly, the intensity of the light can be improved by the lens 150 performing a light concentrating function. The lenses 150 may be arranged at an interval T2 to prevent a dark part on the display panel 1155.

The lens 150 may be spaced apart from the optical member 1155, but the embodiment is not limited thereto.

The optical member 1154 may include at least one of a light guide plate, a diffusion sheet, horizontal and vertical prism sheets, and a brightness enhancement sheet. The light guide plate may include a PC material or a PMMA (Poly methyl methacrylate) material. The light guide plate may be omitted. The diffusion sheet diffuses an incident light, the horizontal and vertical prism sheets concentrate the incident light into the display region, and the brightness enhancement sheet reuses lost light to improve the brightness.

In order to adjust the interval T2 between the lenses 150, a dispersing agent may be contained into the lens 150 or the stack structure of the light guide plate and the optical sheet may be disposed. Accordingly, although the interval T2 of the lenses 150 is increased, the light uniformity can be improved.

The light emitting modules according to the embodiments are applicable to a lighting system such as a lamp, an indicator, and an electrical sign board as well as the display apparatus, but the embodiment is not limited thereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light unit comprising:
   a substrate;
   a plurality of light emitting diodes arrayed on the substrate in a first axis direction;
   a lens on the plurality of light emitting diodes disposed in the first axis direction; and
   an adhesive member between the substrate and the lens,
   wherein the lens has a light incident part on the plurality of light emitting diodes, a light exit part opposite to the light incident part and first and second support parts protruding from the light incident part toward the substrate,
   wherein the light incident part has a first portion at a center of a bottom of the lens and a second portion at an outer region of the bottom of the lens,
   wherein the first portion of the light incident part includes a single groove over the plurality of light emitting diodes, and the second portion of the light incident part has a flat surface,
   wherein the light exit part of the lens has a semi-cylindrical shape, and
   wherein the single groove over the plurality of light emitting diodes is disposed along a lengthwise direction of the lens,
   wherein the single groove has an upward concave curved surface in a third axis direction,
   wherein the light exit part of the lens has a convex curved surface in the third axis direction,
   wherein a length of the single groove of the light incident part is the same as the light exit part in the first axis direction,
   wherein a length of the lens in the first axis direction is two times longer than a bottom width of the lens in a second axis direction,
   wherein the first axis direction is perpendicular to the second axis direction, and
   wherein the third axis direction is perpendicular to the first and second axis directions.

2. The light unit of claim 1, wherein the first and second support parts contact a top surface of the substrate.

3. The light unit of claim 1, further comprising an optical member disposed at one side of the lens.

4. The light unit of claim 1, wherein the adhesive member includes a resin member, and
   wherein a length of the adhesive member is the same as a length of the light exit part in the first axis direction.

5. The light unit of claim 1, wherein the adhesive member is disposed between the first support part and the second support part.

6. The light unit of claim 4, wherein the adhesive member has a top surface contacting the first portion and the second portion and a bottom surface contacting the substrate.

7. The light unit of claim 1, wherein a length of each of the first and second support parts is the same as the light exit part of the lens in the first axis direction.

8. The light unit of claim 1, wherein an interval between the first and second support parts is smaller than a width of the substrate in the second axis direction.

9. A display apparatus comprising:
a plurality of light emitting devices arrayed in a first axis direction;
a substrate having the light emitting devices arrayed in the first axis direction;
a lens on the plurality of light emitting devices arrayed in the first axis direction;
an optical member including at least one of a light guide plate and the optical sheet at one side of the lens; and
a display panel on the optical member,
wherein the lens has a light incident part on the plurality of light emitting devices, and a light exit part opposite to the light incident part,
wherein the light incident part has a first portion at a center of a bottom of the lens and a second portion at an outer region of the bottom of the lens,
wherein the first portion of the light incident part has a first upwardly-recessed groove on the plurality of light emitting devices, and the second portion of the light incident part has a flat surface,
wherein the light exit part of the lens has a semi-cylindrical shape, and
wherein the first upwardly-recessed groove is disposed along a lengthwise direction of the lens,
wherein the first upwardly-recessed groove has an upward concave curved surface in a third axis direction,
wherein the light exit part of the lens has a convex curved surface in the third axis direction,
wherein a length of the first upwardly-recessed groove of the light incident part is the same as a length of the light exit part in the first axis direction,
wherein a length of the lens in the first axis direction is two times longer than a bottom width of the lens in a second axis direction,
wherein the first axis direction is perpendicular to the second axis direction, and
wherein the third axis direction is perpendicular to the first and second axis directions.

10. The display apparatus of claim 9, further comprising:
a reflective plate disposed under the optical member; and
a bottom cover disposed under the reflective plate to cover a peripheral portion of the optical member,
wherein the reflective plate is disposed at one side thereof with a side part to define an opening into which the light emitting device is inserted.

11. The display apparatus of claim 10, wherein the substrate and the lens correspond to at least two lateral surfaces of the light guide plate.

12. A light unit comprising:
a plurality of light emitting devices arrayed in a first axis direction; and
a lens on the plurality of light emitting devices arrayed in the first axis direction,
wherein the lens has a light incident part on the plurality of light emitting devices, and a light exit part opposite to the light incident part,
wherein the light incident part has a first portion at a center of a bottom of the lens and a second portion at an outer region of the bottom of the lens,
wherein the first portion of the light incident part includes a single groove on the plurality of light emitting devices, and the second portion of the light incident part has a flat surface,
wherein the single groove on the plurality of light emitting devices is disposed along a lengthwise direction of the lens,
wherein each of the plurality of light emitting devices include a body with a cavity, a light emitting diode in the cavity, an electrode on a bottom of the cavity and a resin member in the cavity,
wherein the first portion of the light incident part and the second portion of the light incident part are disposed on an upper portion of the resin member,
wherein the single groove has an upward concave curved surface in a third axis direction,
wherein the light exit part of the lens has a convex curved surface in the third axis direction,
wherein a length of the single groove of the light incident part is the same as a length of the light exit part in the first axis direction,
wherein a length of the lens in the first axis direction is two times longer than a bottom width of the lens in a second axis direction,
wherein the first axis direction is perpendicular to the second axis direction, and
wherein the third axis direction is perpendicular to the first and second axis directions.

13. The light unit of claim 12,
wherein the second portion of the light incident part contacts a top surface of the body,
wherein the light incident part contacts at least a portion of a top surface of the resin member, and
wherein a bottom surface of the electrode is exposed.

14. The light unit of claim 12, wherein the second portion of the light incident part has a pattern with a concavo-convex structure in the second axis direction, and
wherein a length of the pattern is the same as the light incident part.

15. The light unit of claim 12, wherein the second portion of the light incident part has a pattern with a prism shape, and
wherein a length of the pattern is the same as the light incident part.

16. The light unit of claim 12, wherein at least a portion of the light exit part of the lens has another groove corresponding to the single groove, and the another groove is disposed along the first axis direction of the lens.

17. The light unit of claim 16, further comprising a reflective member disposed in the another groove and having a different material from a material of the lens.

18. The light unit of claim 17, wherein the reflective member includes at least one selected from the group consisting of a metallic material, a photoresist material, and a metallic oxide.

19. The light unit of claim 16, wherein the another groove is formed in plurality, and the plurality of the another groove being separated from each other along the first axis direction of the lens.

20. The light unit of claim 16, wherein the light exit part of the lens includes a first exit surface having a curved surface and a second exit surface having a curved surface, and
wherein the another groove is disposed between the first and second exit surfaces, and
wherein a length of each of the first and second exit surfaces is the same as the light incident part in the first axis direction.

* * * * *